(12) United States Patent
Katagiri

(10) Patent No.: US 7,694,209 B2
(45) Date of Patent: Apr. 6, 2010

(54) DECODING DEVICE FOR DECODING CODEWORD

(75) Inventor: Hisaaki Katagiri, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 839 days.

(21) Appl. No.: 11/523,650

(22) Filed: Sep. 20, 2006

(65) Prior Publication Data

US 2007/0136644 A1 Jun. 14, 2007

(30) Foreign Application Priority Data

Nov. 22, 2005 (JP) ............................. 2005-337421

(51) Int. Cl.
*H03M 13/00* (2006.01)
(52) U.S. Cl. .................. 714/785; 714/752; 714/758
(58) Field of Classification Search ................ 714/752, 714/755, 758, 769, 784, 785; 370/389, 511, 370/513
See application file for complete search history.

(56) References Cited

U.S. PATENT DOCUMENTS

| | | | | |
|---|---|---|---|---|
| 4,555,784 A | * | 11/1985 | Wood | ................... 714/785 |
| 4,607,367 A | | 8/1986 | Ive et al. | |
| 4,785,451 A | * | 11/1988 | Sako et al. | ................... 714/756 |
| 4,833,679 A | * | 5/1989 | Anderson et al. | ........... 714/758 |
| 5,450,420 A | * | 9/1995 | An et al. | ...................... 714/785 |
| 6,760,880 B1 | * | 7/2004 | Ofek et al. | ................... 714/758 |

FOREIGN PATENT DOCUMENTS

| | | |
|---|---|---|
| JP | 6-91471 B2 | 11/1994 |
| JP | 2539343 B2 | 7/1996 |

* cited by examiner

*Primary Examiner*—Sam Rizk
(74) *Attorney, Agent, or Firm*—Pillsbury Winthrop Shaw Pittman, LLP

(57) ABSTRACT

According to one embodiment, a decoding device decodes a (k+m) bit codeword in accordance with a check matrix. The codeword includes k-bit information symbols and an m-bit parity check code. The check matrix includes a unit matrix and a coefficient matrix. The most significant bit of each of a second vector to a last vector in the coefficient matrix is 1. Binary codes with values 1 to k−1 are sequentially arranged from the second vector to the last vector in a matrix which is obtained by excluding the most significant bits of the second to the last vectors from the matrix including the second to the last vectors. A first vector of the coefficient matrix disagrees with the other vectors in the check matrix, and the first vector is composed of a specified bit pattern having a most significant bit of 0.

11 Claims, 13 Drawing Sheets

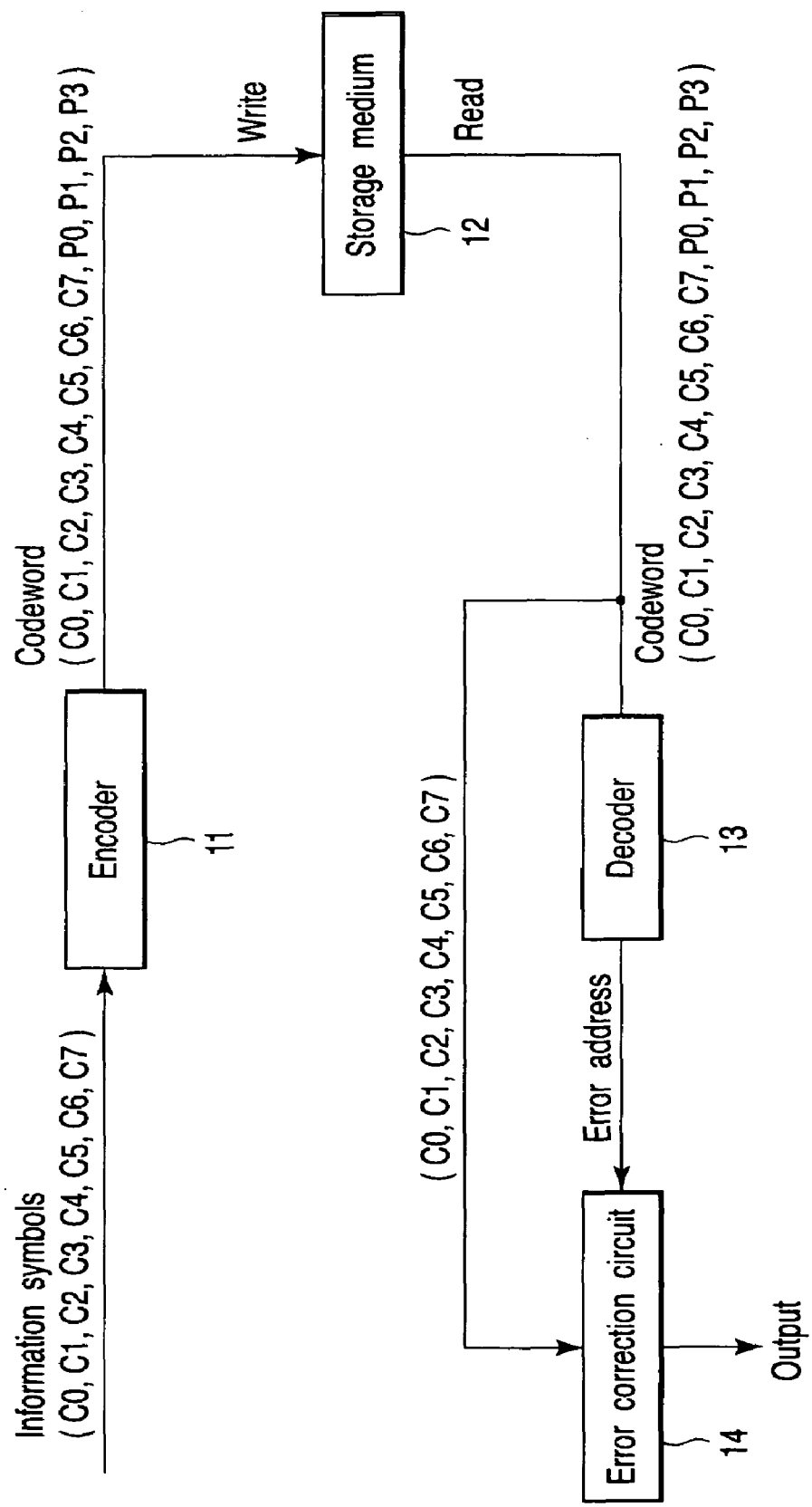
F I G. 1

| Syndrome | Error address |
|---|---|
| 1101 | 0 |
| 1010 | 1 |
| 0101 | 2 |
| 1110 | 3 |
| 0111 | 4 |
| 1111 | 5 |
| 1011 | 6 |
| 1001 | 7 |

DECODING DEVICE FOR DECODING CODEWORD

CROSS-REFERENCE TO RELATED APPLICATIONS

This application is based upon and claims the benefit of priority from Japanese Patent Application No. 2005-337421, filed Nov. 22, 2005, the entire contents of which are incorporated herein by reference.

BACKGROUND

1. Field

One embodiment of the invention relates to a decoding device for decoding a codeword, which includes information symbols and a parity check code, in accordance with a check matrix, and to a storage device and a decoding method.

2. Description of the Related Art

In general, a storage device or a communication device makes use of an error correction function for correcting an error in information symbols. In most of error correction functions, a parity check code is used.

Japanese Patent No. 2539343 discloses an error correction circuit which corrects an error in a data field including parity bits.

In usual cases, a parity check code (also referred to as "parity bits") corresponding to information symbols is generated in accordance with a generator matrix. In addition, a codeword, which includes the information symbols and the generated parity check code, is decoded in accordance with a check matrix corresponding to the generator matrix. In a decoding process for decoding the codeword, a syndrome of the codeword is calculated in accordance with the check matrix. The calculated syndrome is converted to an error address which is indicative of an error position in the information symbols.

The process for converting the calculated syndrome to an error address can be executed by using a combinational circuit. However, if the data length (the number of bits) of the information symbols is large, the circuit scale of the combinational circuit that is necessary for the converting process becomes very large.

Thus, in a decoding device that handles information symbols of great data length, it is not realistic to execute the conversion process by the combinational circuit. Hence, in order to reduce the circuit scale of the decoding device, a novel function is needed for easily determining the error address from the syndrome.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 1 is an exemplary block diagram showing an example of the structure of a system using a decoding device according to an embodiment of the invention;

DETAILED DESCRIPTION

Figure 2:
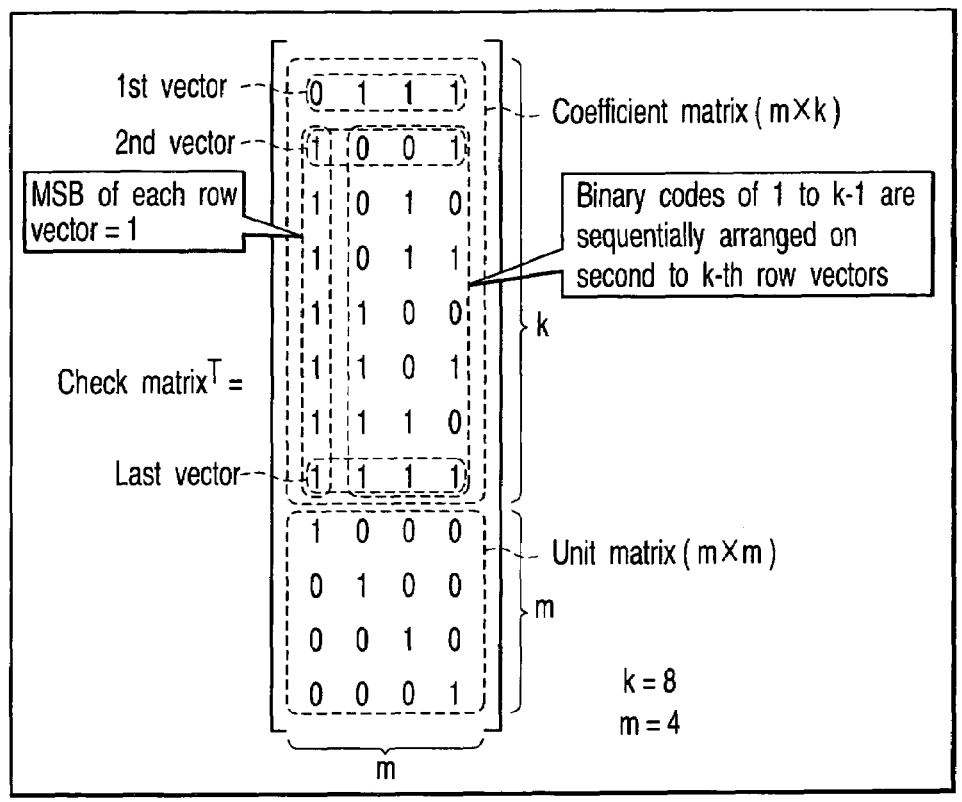
FIG. 2 shows an example of a check matrix (transposed check matrix) which is used by an encoder and a decoder which are provided in the system shown in FIG. 1.

Various embodiments according to the invention will be described hereinafter with reference to the accompanying drawings. In general, according to one embodiment of the invention, a decoding device decodes a (k+m) bit codeword including k-bit information symbols and an m-bit parity check code which is composed of a 1-bit correctable Hamming code. The decoding device includes: a syndrome calculation unit which is configured to calculate, in accordance with a check matrix, an m-bit syndrome corresponding to the (k+m) bit codeword, the m-bit parity check code being generated in accordance with a generator matrix corresponding to the check matrix, the check matrix including a unit matrix and a coefficient matrix, a most significant bit of each of a second vector to a last vector in the coefficient matrix being 1, binary codes with values 1 to k−1 being sequentially arranged from the second vector to the last vector in a matrix which is obtained by excluding the most significant bits of the second to the last vectors from the matrix comprising the second to the last vectors, a first vector of the coefficient matrix disagreeing with the other vectors in the check matrix, the first vector being composed of a specified bit pattern having a most significant bit of 0, and said k and said m being integers which satisfy restrictive conditions of $k+m \leq 2^m-1$ and $k \leq 2^{(m-1)}$; and an error address output unit which is configured to output a lower (m−1) bit data field of the calculated m-bit syndrome as an error address in a case where a most significant bit of the calculated m-bit syndrome is 1 and the calculated m-bit syndrome disagrees with vectors in the unit matrix, and to output 0 as the error address in a case where the calculated m-bit syndrome has the specified bit pattern, the error address being indicative of a bit position in the k-bit information symbols, at which an error occurs.

FIG. 1 shows an example of the structure of a system using a decoder according to an embodiment of the invention. This system is realized as an encoding circuit and a decoding circuit which are provided in a storage device such as a hard disk drive. The encoding and decoding circuits execute an encoding process and a decoding process by using a 1-bit correctable Hamming code.

Assume now that the length (bit number) of information symbols is k bits, and the length (bit number) of a parity check code, which is added to the k-bit information symbols, is m bits. In general, k and m need to meet the following restrictive condition:

$$k+m \leq 2^m-1 \quad (1)$$

where k and m are integers.

In the present embodiment, in order to simplify a process of conversion from a syndrome to an error address, the following restrictive condition (2) is added to the condition (1):

$$k \leq 2^{(m-1)} \quad (2)$$

Examples of k and m, which meet both equations (1) and (2), will now be considered.

Assume now that the bit number k of the information symbols is equal to a bit number (4096 bits) of 1 sector of a hard disk drive, that is, k=4096. In this case, the bit number m of the parity check code, which meets both equations (1) and (2), is, for example, 13 bits.

In the description below, for simple description, it is assumed that the bit number k of the information symbols is 8 bits and the bit number m of the parity check code is 4 bits. In this case, k=8 and m=4 are integers which meet the restrictive conditions of both equations (1) and (2).

In a process of writing data, which is sent from a host device, into a storage medium 12, 8-bit information symbols C0, C1, C2, C3, C4, C5, C6 and C7 that are sent from the host device as write data are first input to an encoder 11.

The encoder 11 encodes the 8-bit information symbols C0, C1, C2, C3, C4, C5, C6, C7 and generates a 12-bit codeword C0, C1, C2, C3, C4, C5, C6, C7, P0, P1, P2, P3, which include the 8-bit information symbols C0, C1, C2, C3, C4, C5, C6, C7 and a 4-bit parity check code P0, P1, P2, P3. The parity check code P0, P1, P2, P3 is composed of a 1-bit correctable Hamming code. The encoding process is executed in accordance with a generator matrix corresponding to a check matrix, which will be described later with reference to FIG. 2. The 12-bit codeword C0, C1, C2, C3, C4, C5, C6, C7, P0, P1, P2, P3 is stored in the storage medium 12.

In a process of reading out the data stored in the storage medium 12 to the host, the 12-bit code C0, C1, C2, C3, C4, C5, C6, C7, P0, P1, P2, P3, which is stored in the storage medium 12, is read out of the storage medium 12 and is input to a decoder 13.

The decoder 13 decodes the 12-bit codeword C0, C1, C2, C3, C4, C5, C6, C7, P0, P1, P2, P3 in accordance with a check matrix, which will be described later with reference to FIG. 2, and generates an error address that is indicative of a bit position (error occurrence position) at which an error occurs in the 8-bit information symbols C0, C1, C2, C3, C4, C5, C6, C7.

An error correction circuit 14 corrects, in accordance with the error address, an error of the 8-bit information symbols C0, C1, C2, C3, C4, C5, C6, C7, which are included in the 12-bit codeword C0, C1, C2, C3, C4, C5, C6, C7, P0, P1, P2, P3 that is read out of the storage medium 12. Specifically, the error correction circuit 14 inverts the logic value of a specific bit in the 8-bit information symbols C0, C1, C2, C3, C4, C5, C6, C7, which is designated by the error address.

Next, referring to FIG. 2, an example of the check matrix, which is used in the present embodiment, is described.

FIG. 2 shows an example of a transposed check matrix.

The transposed check matrix comprises a unit matrix of m×m (=4×4), and a coefficient matrix of m×k (=4×8).

In this case, k and m are integers which meet the following restrictive conditions:

$$k+m \leq 2^{m-1}, \text{ and}$$

$$k \leq 2^{(m-1)}.$$

The most significant bit of each of a second vector to a last vector in the coefficient matrix is 1. In a matrix which is obtained by excluding the most significant bits of the second to the last vectors from the matrix comprising the second to the last vectors, binary codes with values 1 to k−1 are sequentially arranged from the second vector to the last vector. The first vector of the coefficient matrix disagrees with the other vectors, and the first vector is composed of a predetermined bit pattern having the most significant bit of 0.

Specifically, as shown in FIG. 2, the most significant bit of each of (k−1) (=7) row vectors from the second row vector to the k-th (eighth) row vector in the (m×k) coefficient matrix is set at 1. In a matrix of (m−1)×(k−1), i.e. (3×7) matrix, which is obtained by excluding the most significant bits of the (k−1) (=7) row vectors, binary codes (001, 010, 011, 100, 101, 110, 111) with values from 1 to k−1 (=7) are sequentially arranged from the second row vector to the k-th (=7th) row vector. The first row vector of the (m×k) coefficient matrix disagrees with the other vectors of the transposed check matrix, and the first row vector is composed of a predetermined bit pattern (e.g. 0111) having the most significant bit of 0.

By using the check matrix having this structure, the value itself of a syndrome can basically be used as an error address.

Figure 3:
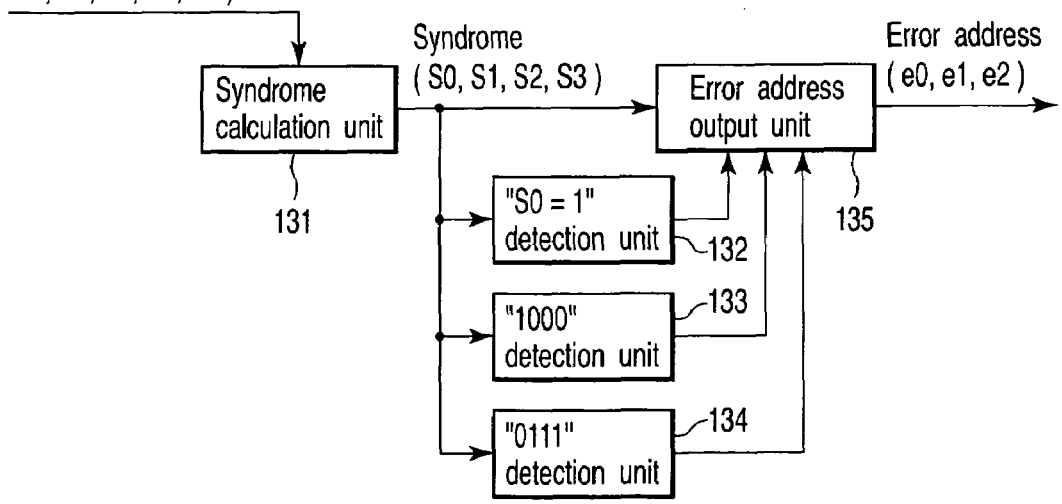
FIG. 3 is an exemplary block diagram showing an example of the structure of the decoder that is provided in the system shown in FIG. 1.

FIG. 3 shows an example of the structure of the decoder 13 shown in FIG. 1.

As shown in FIG. 3, the decoder 13 comprises a syndrome calculation unit 131, an "S0=1" detection unit 132, an "1000" detection unit 133, a "0111" detection unit 134 and an error address output unit 135.

The syndrome calculation unit 131 is configured to calculate a 4-bit syndrome S0, S1, S2, S3, which corresponds to the 12-bit codeword C0, C1, C2, C3, C4, C5, C6, C7, P0, P1, P2, P3, in accordance with the transposed check matrix shown in FIG. 2. The syndrome S0, S1, S2, S3 is obtained by multiplying the codeword C0, C1, C2, C3, C4, C5, C6, C7, P0, P1, P2, P3 by the transposed check matrix.

The "S0=1" detection unit 132 detects that the most significant bit S0 of the calculated 4-bit syndrome S0, S1, S2, S3 is "1". The "1000" detection unit 133 detects that the bit pattern of the calculated 4-bit syndrome S0, S1, S2, S3 is "1000". The "0111" detection unit 134 detects that the bit pattern of the calculated 4-bit syndrome S0, S1, S2, S3 is "0111".

The error address output unit 135 outputs a lower 3-bit data field S1, S2, S3 of the calculated 4-bit syndrome S0, S1, S2, S3 as a 3-bit error address e0, e1, e3, in a case where the most significant bit S0 of the calculated 4-bit syndrome S0, S1, S2, S3 is "1" and the bit pattern of the calculated 4-bit syndrome S0, S1, S2, S3 is a pattern which disagrees with the row vectors in the unit matrix, that is, in a case where S0 is "1" and the bit pattern of the 4-bit syndrome S0, S1, S2, S3 is not "1000".

In addition, the error address output unit 135 outputs 0 as an error address, that is, outputs 0, 0, 0 as e0, e1, e2, in a case where the bit pattern of the calculated 4-bit syndrome S0, S1, S2, S3 is the bit pattern "0111" of the first row vector.

The relationship between the error address and syndrome is explained below.

In the case where the decoding process is executed by using the transposed check matrix shown in FIG. 2, the relationship between the error occurrence position and the syndrome is as follows:

(1) When an error occurs at address 0, i.e. C0, (S0 S1 S2 S3)=(0 1 1 1)

(2) When an error occurs at address 1, i.e. C1, (S0 S1 S2 S3)=(1 0 0 1)

(3) When an error occurs at address 2, i.e. C2, (S0 S1 S2 S3)=(1 0 1 0)

(4) When an error occurs at address 3, i.e. C3, (S0 S1 S2 S3)=(1 0 1 1)

(5) When an error occurs at address 4, i.e. C4, (S0 S1 S2 S3)=(1 1 0 0)

(6) When an error occurs at address 5, i.e. C5, (S0 S1 S2 S3)=(1 1 0 1)

(7) When an error occurs at address 6, i.e. C6, (S0 S1 S2 S3)=(1 1 1 0)

(8) When an error occurs at address 7, i.e. C7, (S0 S1 S2 S3)=(1 1 1 1)

(9) When an error occurs at parity P0, (S0 S1 S2 S3)=(1 0 0 0)

(10) When an error occurs at parity P1, (S0 S1 S2 S3)=(0 1 0 0)

(11) When an error occurs at parity P2, (S0 S1 S2 S3)=(0 0 1 0)

(12) When an error occurs at parity P3, (S0 S1 S2 S3)=(0 0 0 1).

Of the above cases, cases that require error correction are only (1) to (8). Accordingly, if S0 is "1" and the syndrome S0, S1, S2, S3 is not "1000", S1, S2, S3 can directly be used as an error address e0, e1, e2. If the syndrome S0, S1, S2, S3 is "0111", 0, 0, 0 may be output as e0, e1, e2 so that an error address may indicate 0.

As described above, by using the check matrix (transposed) shown in FIG. 2, an error address can easily be determined from the syndrome.

FIG. 2 shows the example of the structure of the transposed check matrix. However, the encoding process and decoding process can be executed by using a non-transposed, standard-form check matrix.

Figure 4:
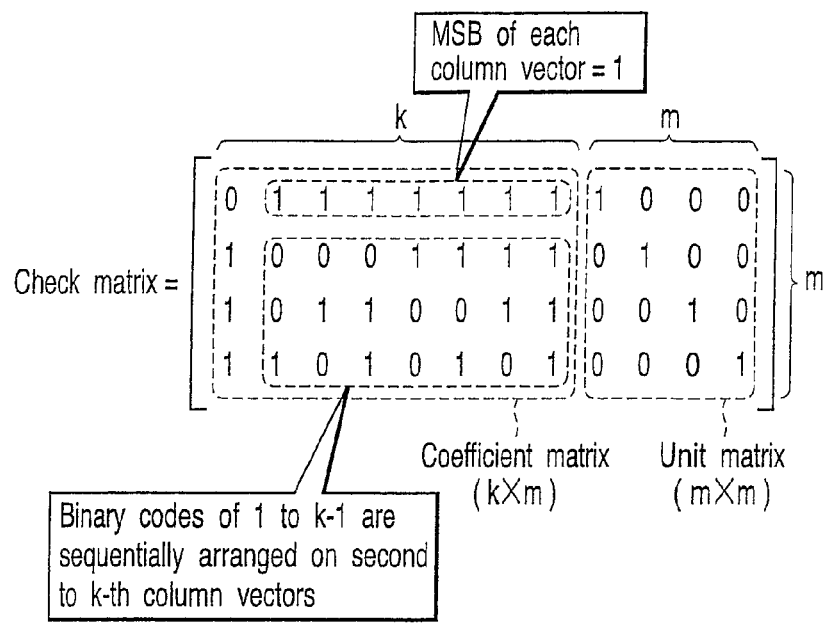
FIG. 4 shows an example of a check matrix (standard system) which is used by the encoder and decoder provided in the system shown in FIG. 1.

FIG. 4 shows a standard-form check matrix, which corresponds to the transposed check matrix shown in FIG. 2.

The check matrix shown in FIG. 4 is obtained by further transposing the transposed check matrix shown in FIG. 2. The check matrix shown in FIG. 4 comprises a unit matrix of m×m (=4×4) and a coefficient matrix of k×m (=8×4).

The most significant bit (firs-row bit) of each of (k−1) (=7) column vectors from the second column vector to the k-th (eighth) column vector in the (k×m) coefficient matrix is 1. In a matrix of (k−1)×(m−1), i.e. (7×3) matrix, which is obtained by excluding the most significant bits of the (k−1) (=7) column vectors, binary codes (001, 010, 011, 100, 101, 110, 111) with values from 1 to k−1 (=7) are sequentially arranged from the second column vector to the k-th (=7th) column vector.

The first column vector of the (k×m) coefficient matrix disagrees with the other column vectors of the check matrix, and the first column vector is composed of a predetermined bit pattern (e.g. 0111) having the most significant bit of 0.

Since the check matrix of FIG. 4 is equivalent to the transposed check matrix of FIG. 2, even when the check matrix of FIG. 4 is used, the same advantageous effect as in the case of using the transposed check matrix shown in FIG. 2 can be obtained.

Next, in order to clarify the features of the present embodiment, an ordinary encoding circuit and an ordinary decoding circuit, which use an ordinary check matrix, is described referring to FIG. 5 to FIG. 10.

Figure 5:
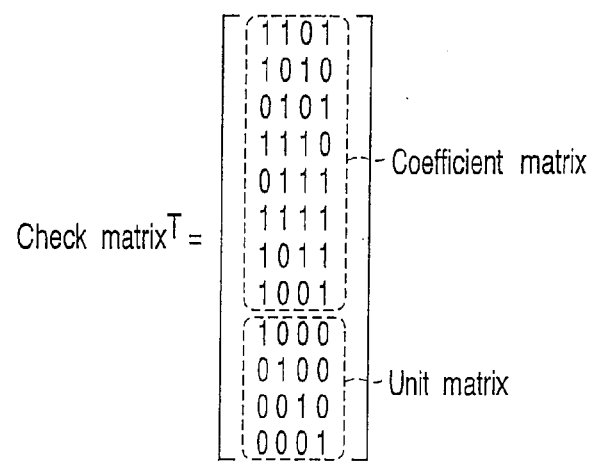
FIG. 5 shows an example of an ordinary check matrix.

FIG. 5 shows an example of the structure of an ordinary transposed check matrix in the case of m=4 and k=8.

The ordinary transposed check matrix comprises a unit matrix of 4×4 and a coefficient matrix of 4×8. In the coefficient matrix of 4×8, eight 4-bit row vectors are arranged. Each row vector is composed of one of arbitrary bit patterns excluding "0000". In this case, the sole restrictive condition is that all row vectors in the transposed check matrix are different from one another.

Figure 6:
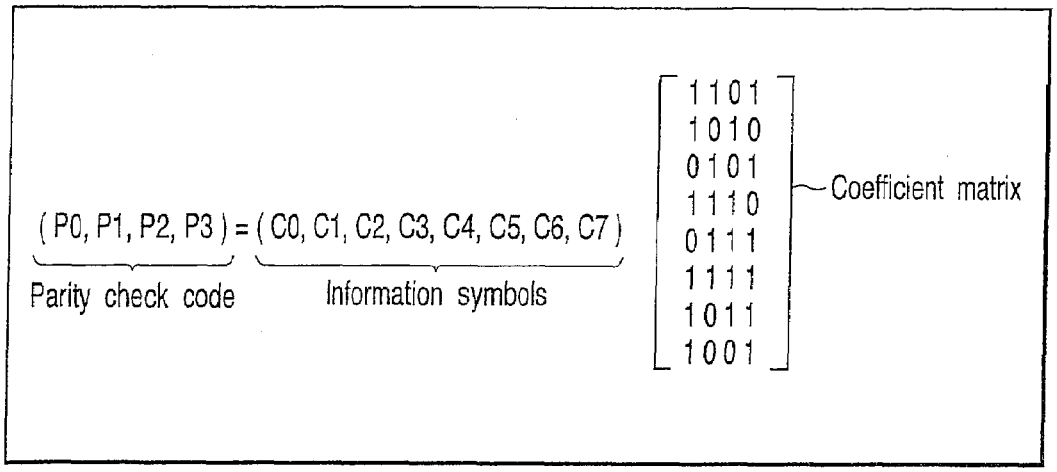
FIG. 6 is an exemplary view for explaining an arithmetic operation for generating parity bits.

Assuming that information symbols are C0, C1, C2, C3, C4, C5, C6, C7 and a parity check code to be obtained is P0, P1, P2, P3, the parity check code P0, P1, P2, P3 is calculated by an arithmetic operation illustrated in FIG. 6.

Specifically, P0, P1, P2 and P3 are given by the following equations:

$P0=C0+C1+C3+C5+C6+C7$ $P1=C0+C2+C3+C4+C5$ $P2=C1+C3+C4+C5+C6$ $P3=C0+C2+C4+C5+C6+C7.$

Figure 7:
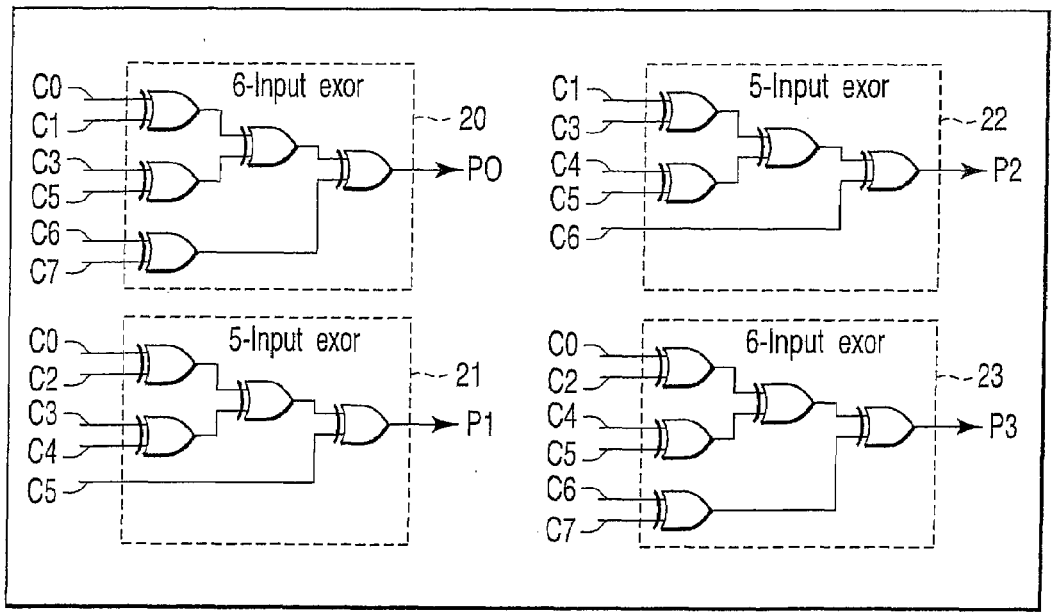
FIG. 7 is an exemplary circuit diagram showing the structure of an ordinary encoder.

Thus, the encoder for calculating P0, P1, P2 and P3 is realized by combinational circuits shown in FIG. 7.

P0 is calculated by a 6-input EXOR (exclusive OR) circuit 20 which adds C0, C1, C3, C5, C6 and C7. P1 is calculated by a 5-input EXOR circuit 21 which adds C0, C2, C3, C4 and C5. P2 is calculated by a 5-input EXOR circuit 22 which adds C1, C3, C4, C5 and C6. P3 is calculated by a 6-input EXOR circuit 23 which adds C0, C2, C4, C5, C6 and C7.

Figure 8:
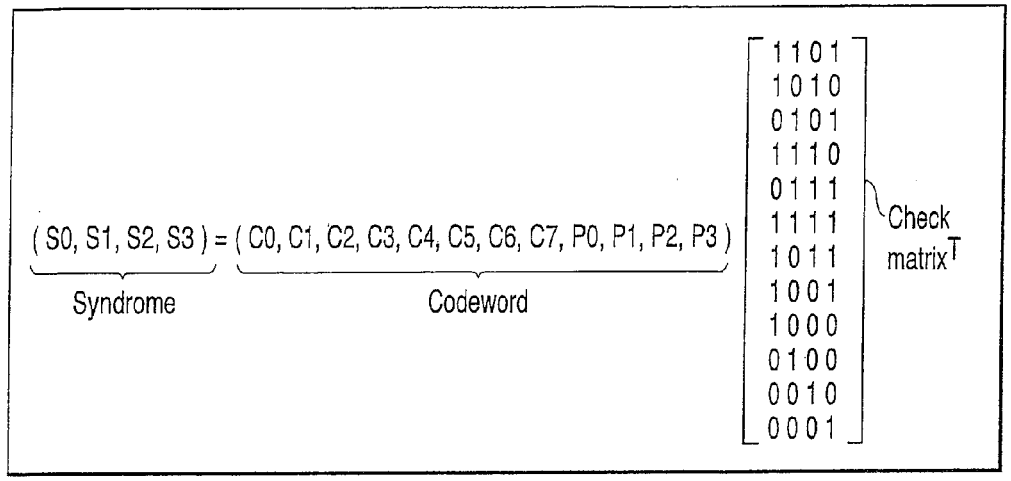
FIG. 8 is a view for explaining an arithmetic operation for generating a syndrome.

The syndrome S0, S1, S2, S3 of the codeword C0, C1, C2, C3, C4, C5, C6, C7, P0, P1, P2, P3 is calculated by an arithmetic operation illustrated in FIG. 8.

Figure 9:
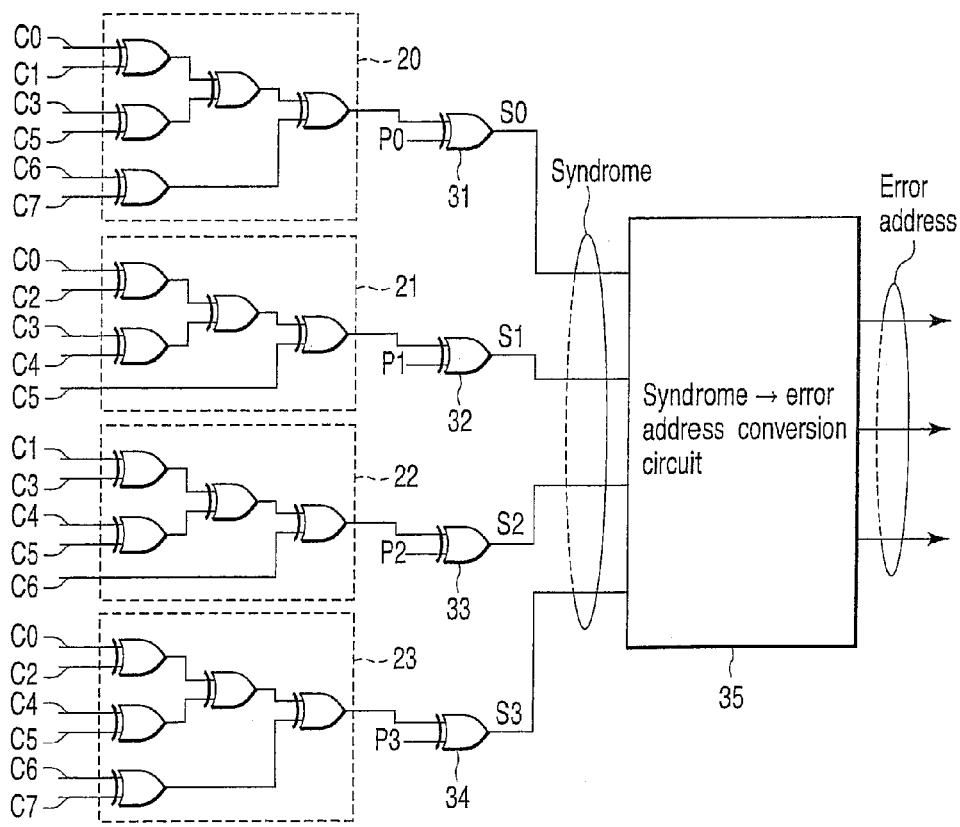
FIG. 9 is an exemplary circuit diagram showing the structure of an ordinary decoder.

Thus, the decoder can be constructed as shown in FIG. 9.

An EXOR circuit 31 adds the output value of the 6-input EXOR circuit 20, which has been described with reference to FIG. 7, and P0, thereby calculating S0. An EXOR circuit 32 adds the output value of the 5-input EXOR circuit 21, which is shown in FIG. 7, and P1, thereby calculating S1. An EXOR circuit 33 adds the output value of the 5-input EXOR circuit 22, which is shown in FIG. 7, and P2, thereby calculating S2. An EXOR circuit 34 adds the output value of the 6-input EXOR circuit 23, which is shown in FIG. 7, and P3, thereby calculating S3.

A syndrome→error address conversion circuit 35 converts the syndrome S0, S1, S2, S3 to an error address. The syndrome→error address conversion circuit 35 executes a conversion process which is indicated in a conversion table shown in FIG. 10.

For example, in the case where S0, S1, S2 and S3 are "1101", since "1101" is present in the first row of the transposed check matrix of FIG. 5, it is necessary to convert "1101" to an error address 0 which indicates that an error occurs at the first bit C0 of the codeword. Similarly, in the case where S0, S1, S2 and S3 are "1010", since "1010" is present in the second row of the transposed check matrix of FIG. 5, it is necessary to convert "1010" to an error address 1 which indicates that an error occurs at the second bit C1 of the codeword.

If the bit number of information symbols increases, the circuit scale of combinational circuits for converting the syndrome to the error address becomes enormous.

Figures 10, 11:
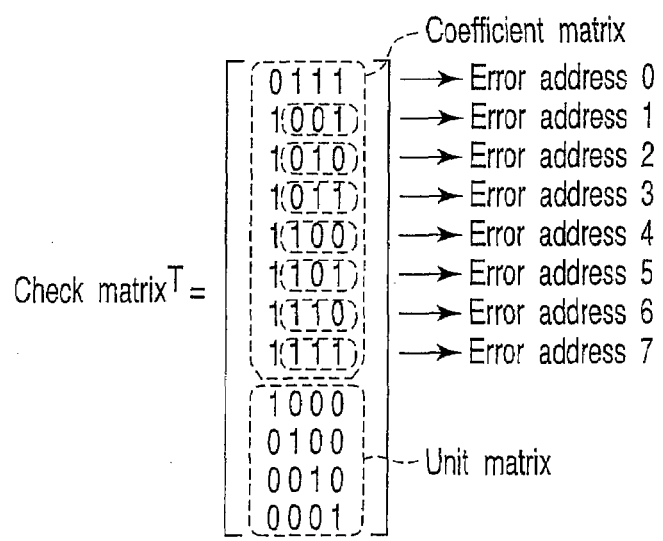
FIG. 10 is an exemplary view for explaining a process of converting a syndrome to an error address.
FIG. 11 is an exemplary view for explaining a relationship between a check matrix, which is used in the system shown in FIG. 1, and an error address.

As is shown in FIG. 11, in the check matrix (transposed check matrix) used in the present embodiment, binary codes in the range of from 1 to 7 are sequentially arranged on the second vector to the last vector of the coefficient matrix. Thus, in cases other than the case in which the calculated syndrome S0, S1, S2, S3 is "0111", the lower three bits S1, S2 and S3 of the calculated syndrome S0, S1, S2, S3 can directly be used as an error address.

Figure 12:
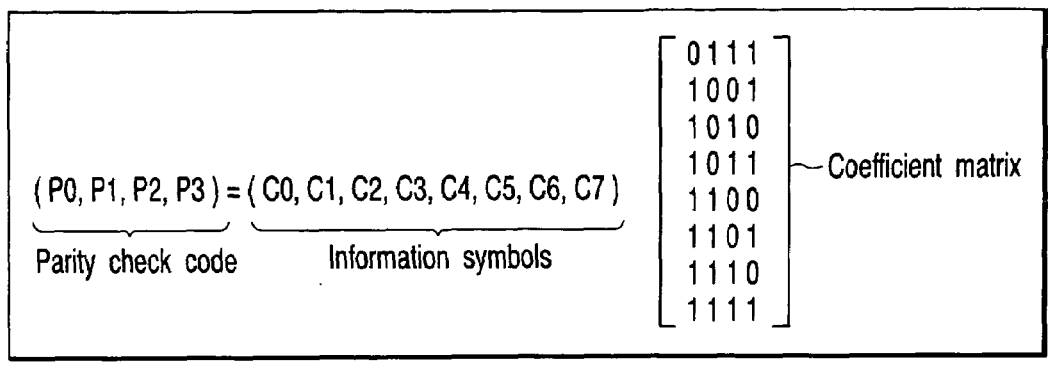
FIG. 12 is an exemplary view for explaining an arithmetic operation for generating a syndrome.

In the present embodiment, P0, P1, P2 and P3 are calculated by an arithmetic operation illustrated in FIG. 12. A (4×8) matrix on the right side in FIG. 12 is a generator matrix, and this generator matrix agrees with the coefficient matrix in the transposed check matrix shown in FIG. 2.

Figure 13:
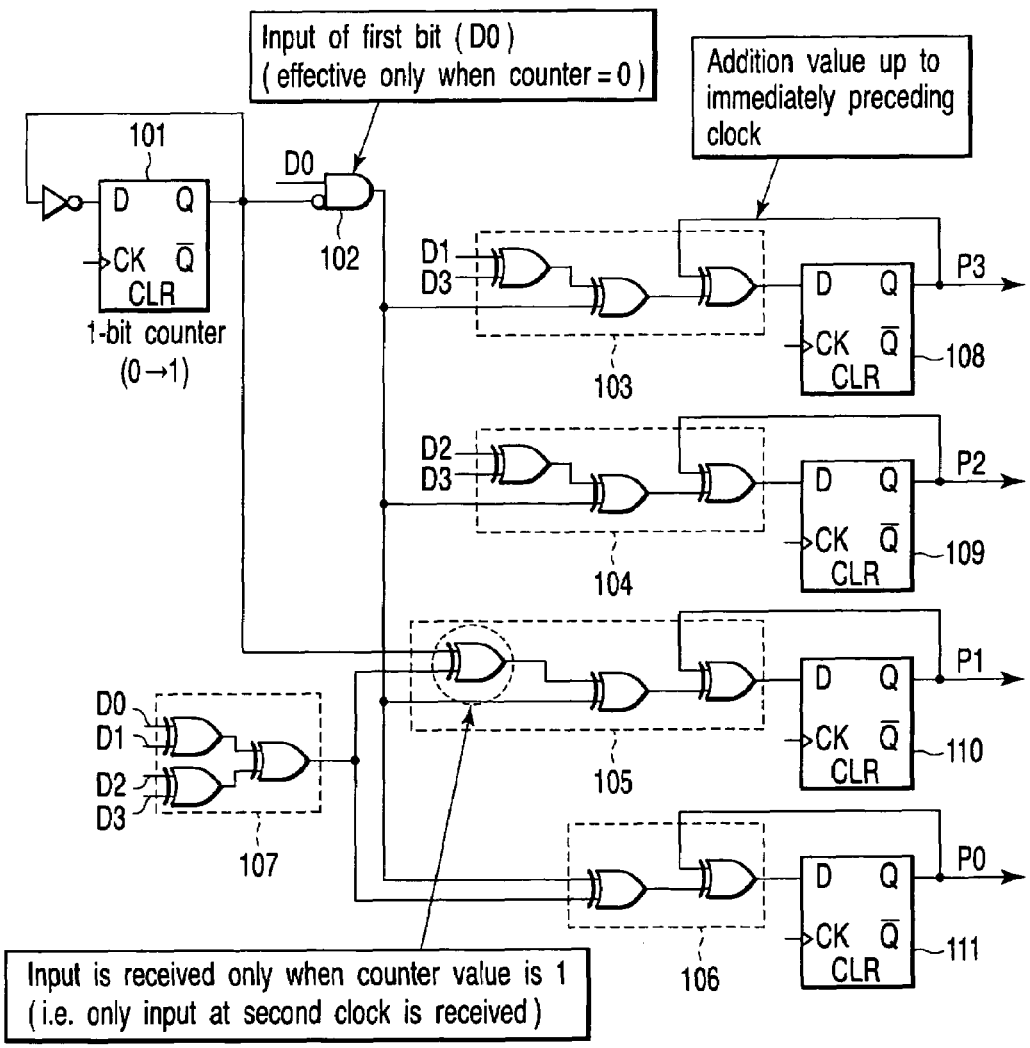
FIG. 13 is an exemplary circuit diagram showing an example of the structure of an encoder which is provided in the system shown in FIG. 1.

FIG. 13 shows an example of the circuit structure of the encoder 11 that is used in the present embodiment. The encoder 11 repeatedly receives 8-bit information symbols C0, C1, C2, C3, C4, C5, C6 and C7 in units of a data field (e.g. in units of four bits) of bits, the number of which is a power of 2. In units of the input data field, the encoder 11 executes a matrix arithmetic operation between the data field and the coefficient matrix in the transposed check matrix of FIG. 2. Thus, the encoder 11 generates a 4-bit parity check code P0, P1, P2, P3.

Specifically, in the encoder 11, 4-bit data can be processed per 1 clock. In the description below, 4-bit data, which is input per 1 clock, is expressed as D0, D1, D2, D3. 4-bit data D0, D1, D2, D3, which is processed at the first clock, corresponds to C0, C1, C2, C3. 4-bit data D0, D1, D2, D3, which is processed at the second clock, corresponds to C4, C5, C6, C7.

The encoder 11 comprises a 1-bit counter 101, an AND gate 102, a 4-input EXOR circuit 103, a 4-input EXOR circuit 104, a 4-input EXOR circuit 105, a 3-input EXOR circuit 106, a 4-input EXOR circuit 107, and four D flip-flops 108 to 111.

Figure 14:
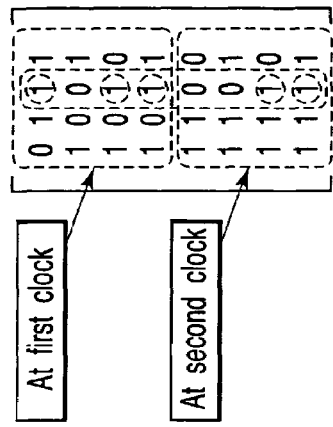
FIG. 14 is an exemplary view for explaining the operation of the encoder shown in FIG. 13.
Figure 14:
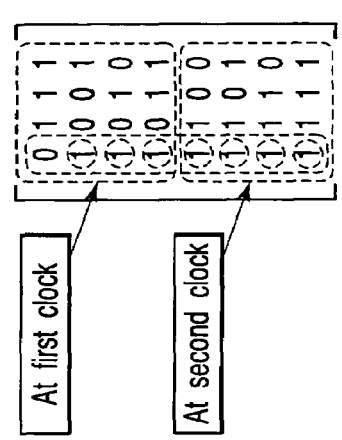
Figure 14:
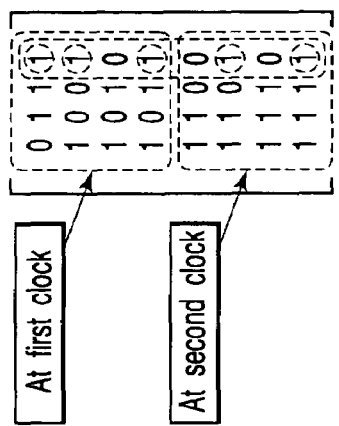
Figure 14:
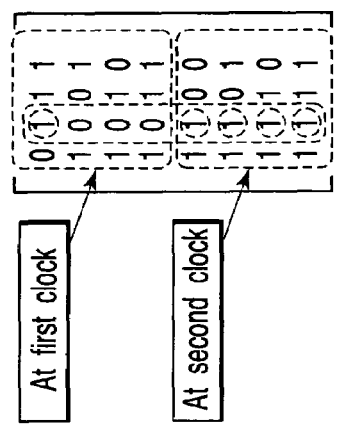

The 1-bit counter 101 outputs 0 at the first clock, and outputs 1 at the second clock. The 4-input EXOR circuit 103 and the D flip-flop 108 are circuits which execute a matrix arithmetic operation between the information symbols C0, C1, C2, C3, C4, C5, C6, C7 and a column vector 1, 1, 0, 1, 0, 1, 0, 1, thereby calculating P3. As is shown in FIG. 14, the 4-input EXOR circuit 103 executes an arithmetic operation of D0+D1+D3 in accordance with the column vector 1, 1, 0, 1 at the first clock, and stores the result of the arithmetic operation in the D flip-flop 108. At the second clock, the 4-input EXOR circuit 103 executes an arithmetic operation of D1+D3 in accordance with the column vector 0, 1, 0, 1, and adds the result of the arithmetic operation (D1+D3) to the output (=D0+D1+D3) of the D flip-flop 108. Thereby, C0+C1+C3+C5+C7 is calculated as P3.

The 4-input EXOR circuit 104 and the D flip-flop 109 are circuits which execute a matrix arithmetic operation between the information symbols C0, C1, C2, C3, C4, C5, C6, C7 and a column vector 1, 0, 1, 1, 0, 0, 1, 1, thereby calculating P2. As is shown in FIG. 14, the 4-input EXOR circuit 104 executes an arithmetic operation of D0+D2+D3 in accordance with the column vector 1, 0, 1, 1 at the first clock, and stores the result of the arithmetic operation in the D flip-flop 109. At the second clock, the 4-input EXOR circuit 104 executes an arithmetic operation of D2+D3 in accordance with the column vector 0, 0, 1, 1, and adds the result of the arithmetic operation (D2+D3) to the output (=D0+D2+D3) of the D flip-flop 109. Thereby, C0+C2+C3+C6+C7 is calculated as P2.

The 4-input EXOR circuit 105 and the D flip-flop 110 are circuits which execute a matrix arithmetic operation between the information symbols C0, C1, C2, C3, C4, C5, C6, C7 and a column vector 1, 0, 0, 1, 1, 1, 1, 1, thereby calculating P1. As is shown in FIG. 14, the 4-input EXOR circuit 105 stores D0 in the D flip-flop 110 in accordance with the column vector 1, 0, 0, 0 at the first clock. At the second clock, the 4-input EXOR circuit 105 receives the output (=D0+D1+D2+D3) of the 4-input EXOR circuit 107 in accordance with the column vector 1, 1, 1, 1, and adds the output (=D0+D1+D2+D3) of the 4-input EXOR circuit 107 to the output (=D0) of the D flip-flop 110. Thereby, C0+C4+C5+C6+C7 is calculated as P1.

The 3-input EXOR circuit 106 and the D flip-flop 111 are circuits which execute a matrix arithmetic operation between the information symbols C0, C1, C2, C3, C4, C5, C6, C7 and a column vector 0, 1, 1, 1, 1, 1, 1, 1, thereby calculating P0. As is shown in FIG. 14, the 3-input EXOR circuit 106 calculates D1+D2+D3 by an exclusive-OR operation between the output (=D0+D1+D2+D3) of the 4-input EXOR circuit 107 and D0 in accordance with the column vector 0, 1, 1, 1 at the first clock, and stores the calculated result D1+D2+D3 in the D flip-flop 111. At the second clock, the 3-input EXOR circuit 106 receives the output (=D0+D1+D2+D3) of the 4-input EXOR circuit 107 in accordance with the column vector 1, 1, 1, 1, and adds the output (=D0+D1+D2+D3) of the 4-input EXOR circuit 107 to the output (=D0+D1+D2+D3) of the D flip-flop 111. Thereby, C1+C2+C3+C4+C5+C6+C7 is calculated as P0.

Figure 15:
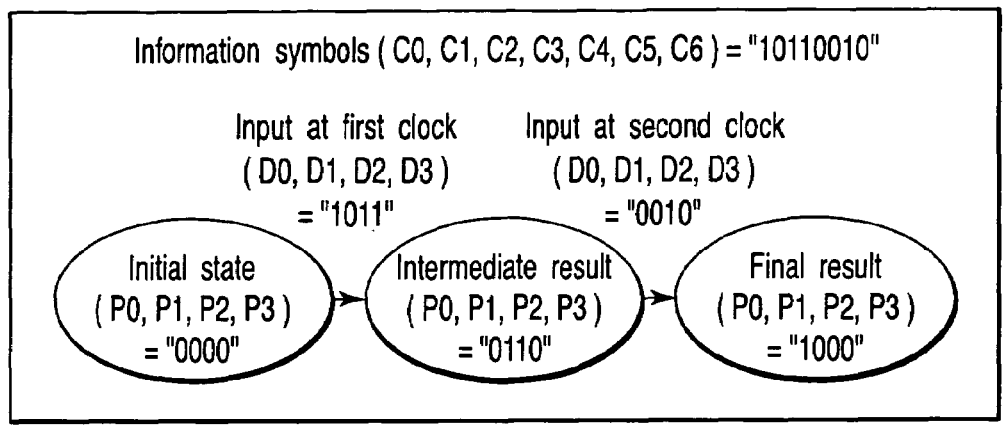
FIG. 15 is an exemplary view for describing a specific example of the content of an encoding process which is executed by the encoder shown in FIG. 13.

FIG. 15 illustrates the encoding process by the encoder 11 shown in FIG. 13, in the case of the information symbols C0, C1, C2, C3, C4, C5, C6, C7="10110010".

In the initial state, the output P0, P1, P2, P3 of the encoder 11 is "0000". At the first clock, the upper 4-bit data field "1011" of the "10110010" is input as D1, D2, D3, D4 to the encoder 11, and the output P0, P1, P2, P3 of the encoder 11 becomes "0110". At the second clock, the lower 4-bit data field "0010" of the "10110010" is input as D1, D2, D3, D4 to the encoder 11, and the output P0, P1, P2, P3 of the encoder 11 becomes "1000".

Figure 16:
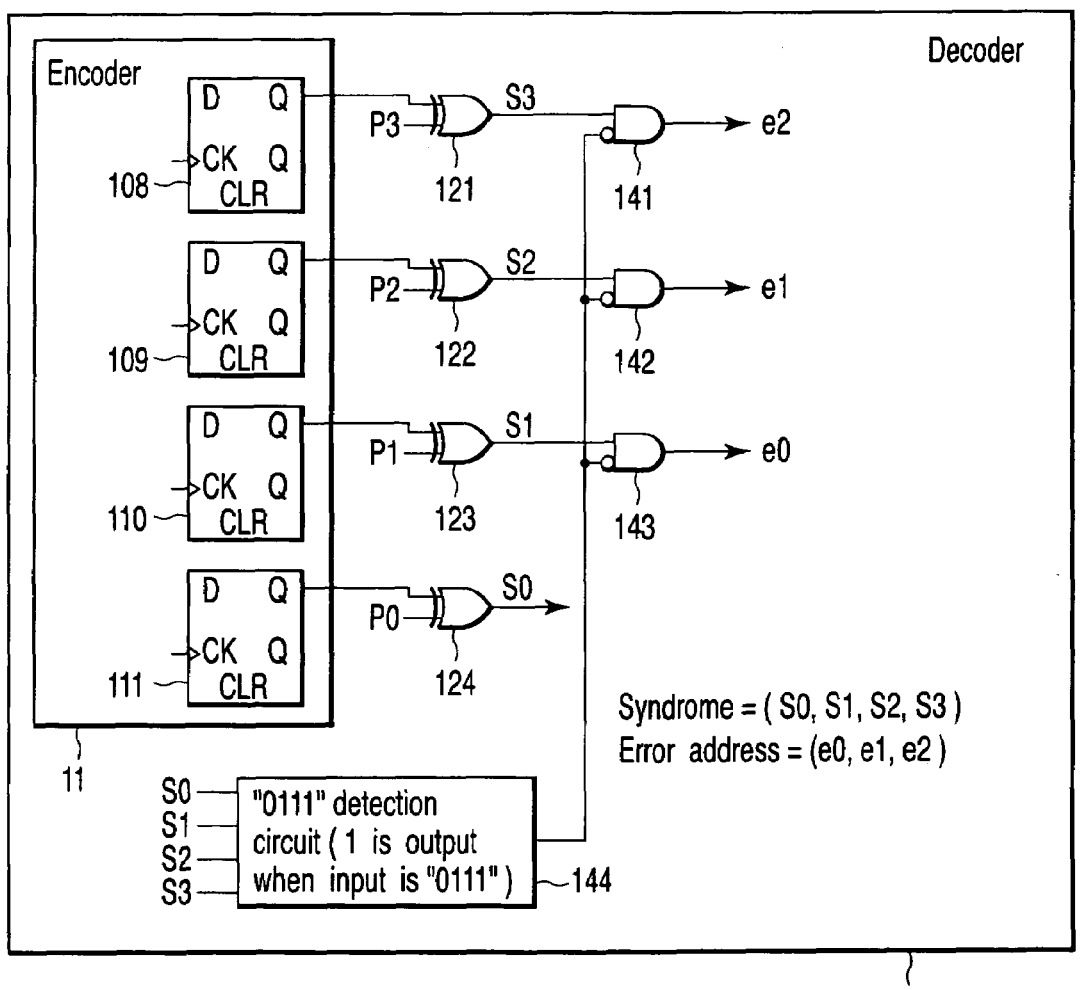
FIG. 16 is an exemplary circuit diagram showing an example of the structure of a decoder which is provided in the system shown in FIG. 1.

FIG. 16 shows an example of the structure of the decoder 13.

As is shown in FIG. 16, the decoder 13 is realized by using the encoder 11 shown in FIG. 13. Specifically, the decoder 13 comprises the encoder 11, four 2-input EXOR circuits 121 to 124, three 2-input AND gates 141 to 143, and a "0111" detection circuit 144.

The 2-input EXOR circuit 121 calculates S3 by adding the output value of the D flip-flop 108 at the second clock and P3 of the codeword C0, C1, C2, C3, C4, C5, C6, C7, P0, P1, P2, P3.

The 2-input EXOR circuit 122 calculates S2 by adding the output value of the D flip-flop 109 at the second clock and P2 of the codeword C0, C1, C2, C3, C4, C5, C6, C7, P0, P1, P2, P3.

The 2-input EXOR circuit 123 calculates S1 by adding the output value of the D flip-flop 110 at the second clock and P1 of the codeword C0, C1, C2, C3, C4, C5, C6, C7, P0, P1, P2, P3.

The 2-input EXOR circuit 124 calculates S0 by adding the output value of the D flip-flop 111 at the second clock and P0 of the codeword C0, C1, C2, C3, C4, C5, C6, C7, P0, P1, P2, P3.

The "0111" detection circuit 144 outputs 1 when the calculated syndrome S0, S1, S2, S3 is "0111", and outputs 0 in other cases. If the output of the "0111" detection circuit 144 is 0, the AND gates 141 to 143 output S1, S2, S3 as e0, e1, e2. On the other hand, if the output of the "0111" detection circuit 144 is 1, the AND gates 141 to 143 output inverted values of S1, S2, S3 as e0, e1, e2. S0 is used in order to generate two error flags #1 and #2, which will be described later. By using the error flags #1 and #2, e0, e1, e2 can correctly be used as the error address.

Figure 17:
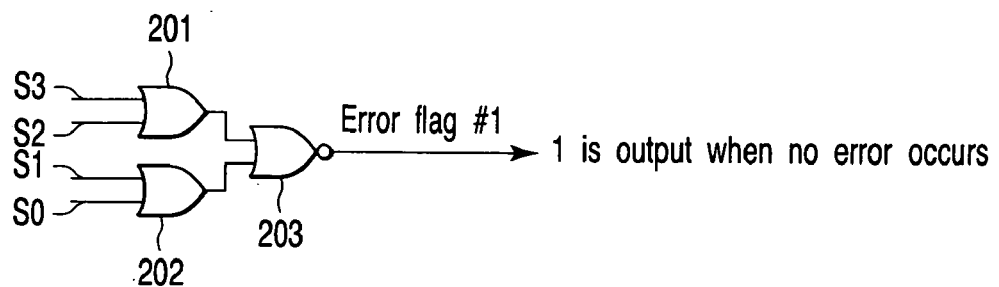
FIG. 17 shows an example of an error flag #1 output circuit which is provided in the decoder shown in FIG. 16.

FIG. 17 shows an example of an error flag #1 output circuit which is provided in the decoder 13. This circuit comprises two 2-input OR circuits 201 and 202 and a 2-input NOR circuit 203. When S0, S1, S2, S3 is "0000", the error flag #1 output circuit outputs an error flag #1 of 1. The error flag #1 of 1 indicates no occurrence of an error.

Figure 18:
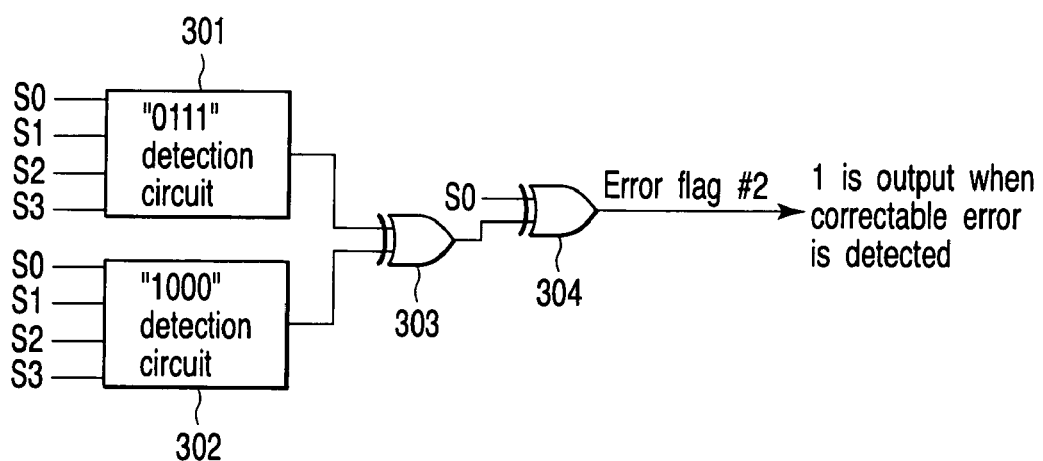
FIG. 18 shows an example of an error flag #2 output circuit which is provided in the decoder shown in FIG. 16.

FIG. 18 shows an example of an error flag #2 output circuit which is provided in the decoder 13. This circuit generates an error flag #2 of 1 when a correctable error is detected. This circuit comprises a "0111" detection circuit 301, a "1000" detection circuit 302, and two 2-input EXOR circuits 303 and 304. The "0111" detection circuit 301 outputs 1 when S0, S1, S2, S3 is "0111". The "1000" detection circuit 302 outputs 1 when S0, S1, S2, S3 is "1000".

Cases in which a 1-bit error occurs can be classified as follows:

(1) When an error occurs at address 0, that is, (S0 S1 S2 S3)=(0 1 1 1)
(2) When an error occurs at address 1, that is, (S0 S1 S2 S3)=(1 0 0 1)
(3) When an error occurs at address 2, that is, (S0 S1 S2 S3)=(1 0 1 0)
(4) When an error occurs at address 3, that is, (S0 S1 S2 S3)=(1 0 1 1)
(5) When an error occurs at address 4, that is, (S0 S1 S2 S3)=(1 1 0 0)
(6) When an error occurs at address 5, that is, (S0 S1 S2 S3)=(1 1 0 1)
(7) When an error occurs at address 6, that is, (S0 S1 S2 S3)=(1 1 1 0)
(8) When an error occurs at address 7, that is, (S0 S1 S2 S3)=(1 1 1 1)
(9) When an error occurs at parity 0, that is, (S0 S1 S2 S3)=(1 0 0 0)
(10) When an error occurs at parity 1, that is, (S0 S1 S2 S3)=(0 1 0 0)
(11) When an error occurs at parity 2, that is, (S0 S1 S2 S3)=(0 0 1 0)
(12) When an error occurs at parity 3, that is, (S0 S1 S2 S3)=(0 0 0 1).

Of these cases, only (1) to (8) require error correction. Accordingly, the error flag #2 may be set at 1 only when cases (1) to (8) occur.

Cases (2) to (9) are common in that the output of S0 is 1. Thus, the error flag #2 can be generated by adding case (1) to, and excluding case (9) from, the cases (2) to (9) in which the condition S0=1 is established. The arithmetic operation of adding case (1) to, and excluding case (9) from, the cases (2) to (9) in which the condition S0=1 is established is realized by calculating an exclusive OR between the output of the "0111" detection circuit 301 and the output of the "1000" detection circuit 302.

Figure 19:
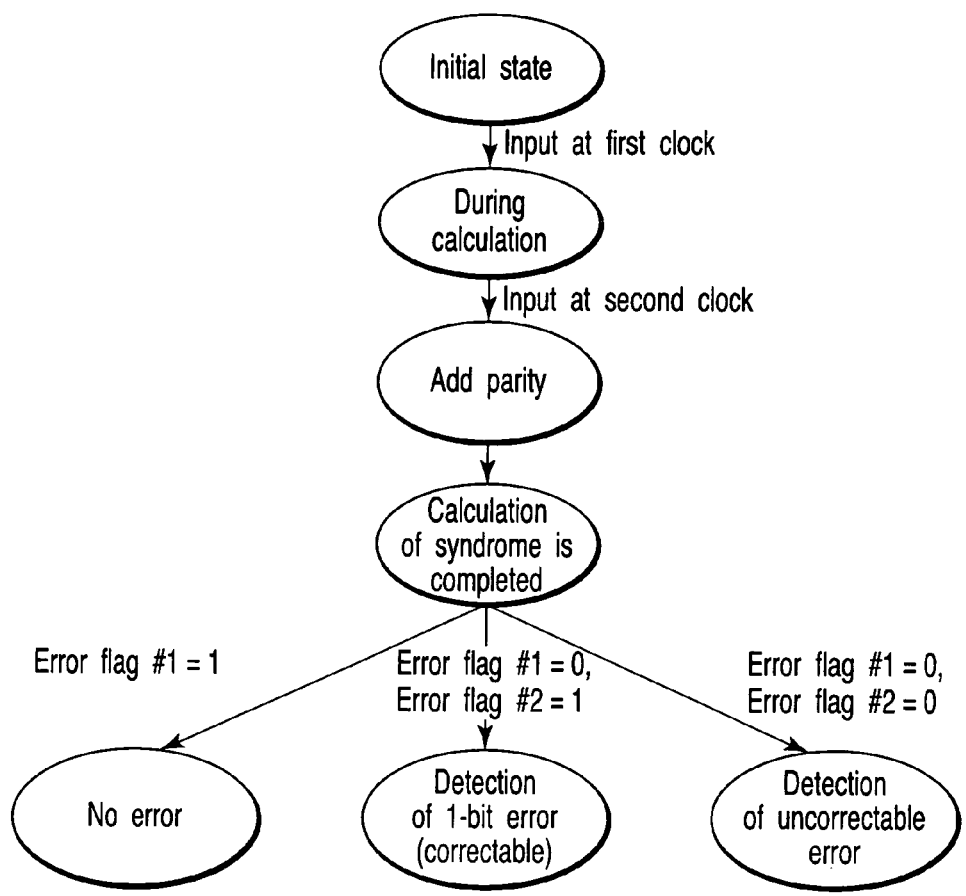
FIG. 19 shows an example of the procedure of a decoding process which is executed by the decoder shown in FIG. 16.

FIG. 19 illustrates the procedure of the decoding process. As described above, the syndrome S0, S1, S2, S3 is calculated by adding P0, P1, P2, P3 to the arithmetic operation result of the encoder 11. If no error occurs, the error flag #1 is 1. If a 1-bit error occurs, the error flag #1 is 0 and the error flag #2 is 1. If an uncorrectable error occurs, the error flag #1 is 0 and the error flag #2 is 0.

Figure 20:
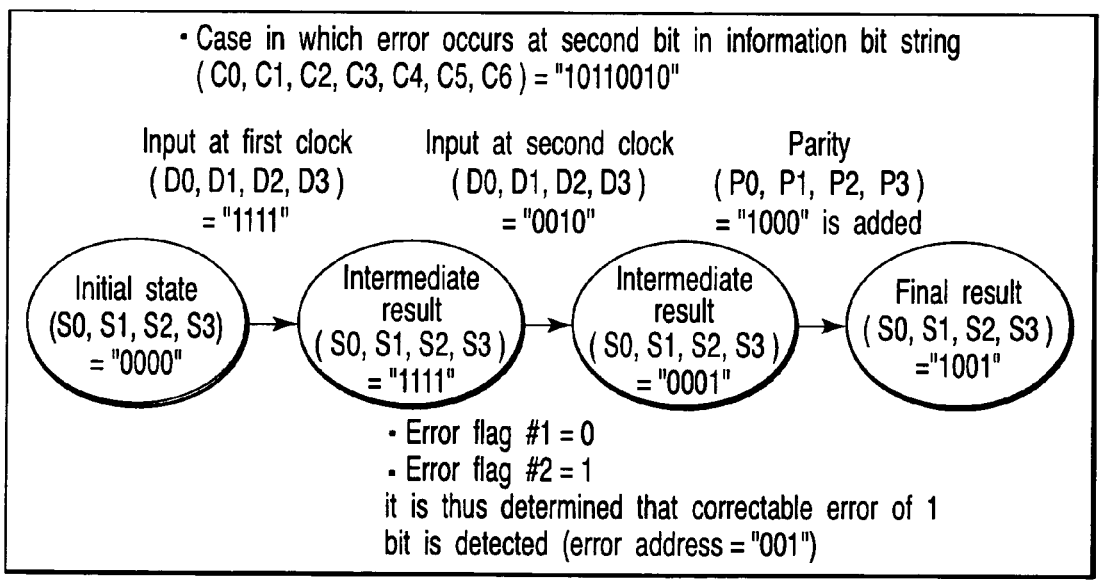
FIG. 20 is an exemplary view for explaining a specific example of the content of the decoding process which is executed by the decoder shown in FIG. 16.

FIG. 20 illustrates the decoding process by the decoder 13 in the case where the information symbols C0, C1, C2, C3, C4, C5, C6, C7="10110010" and an error occurs at the second bit. Since the error occurs at the second bit, the upper 4-bit data field C0, C1, C2, C3="1111".

In the initial state, S0, S1, S2, S3 is "0000". At the first clock, the upper 4-bit data field "1111" is input as D1, D2, D3, D4 to the decoder 13, and S0, S1, S2, S3 becomes "1111". At the second clock, lower 4-bit data field "0010" is input as D1, D2, D3, D4 to the decoder 13, and S0, S1, S2, S3 becomes "0001". P0, P1, P2, P3 is added to S0, S1, S2, S3, and the final result of S0, S1, S2, S3 becomes "1001". In this case, S0 is 1 and S0, S1, S2, S3 is not "1000". Thus, S0, S1, S2, S3 directly indicates a position where a correctable error occurs.

Specifically, the error flag #1=0 and the error flag #2=1 if S0, S1, S2, S3="1001". Thus, the occurrence of a 1-bit error is detected. The error address is "001" which indicates that an error occurs at the second bit.

Figure 21:
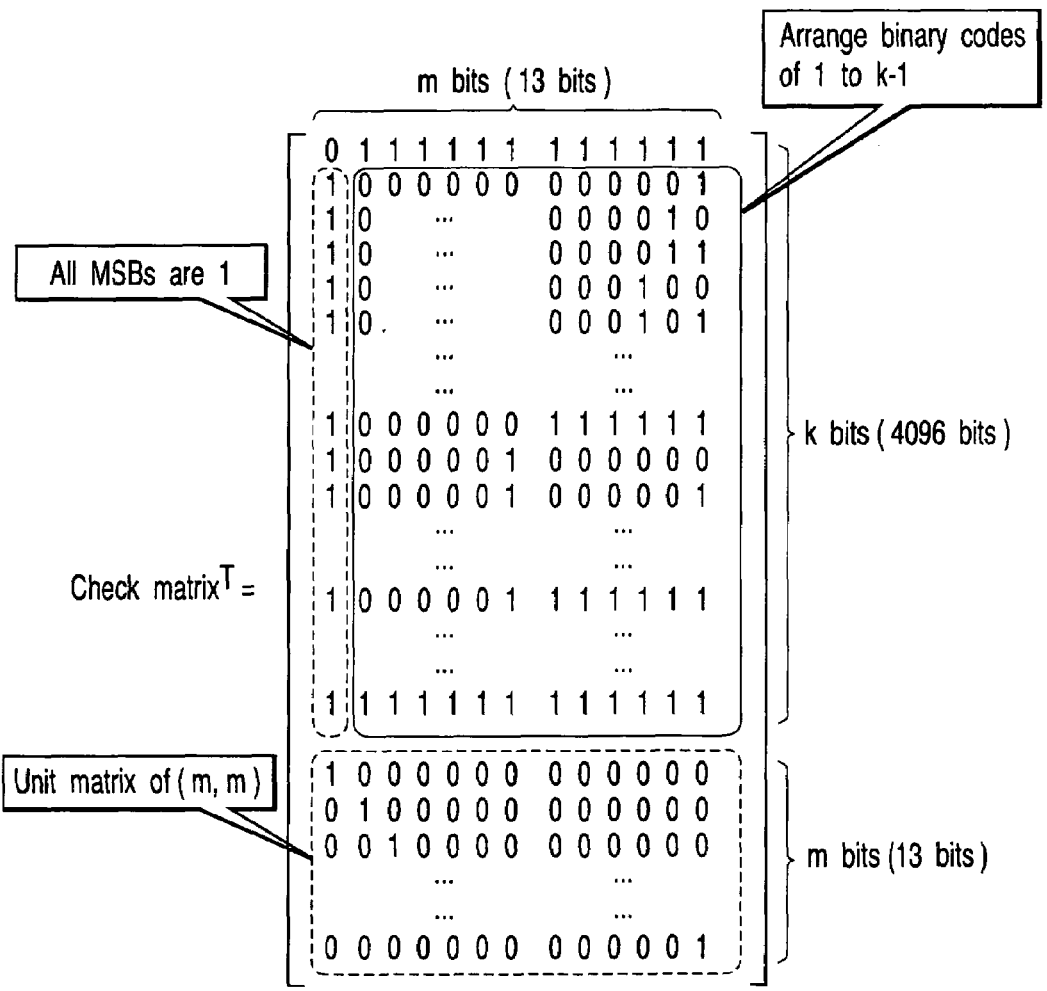
FIG. 21 shows another example of the check matrix which is used in the system shown in FIG. 1.

FIG. 21 shows an example of a transposed check matrix corresponding to a case where the bit number k of the information symbols is the bit number (4096 bits) of 1 sector of a hard disk drive and the bit number m of the parity check code is 13 bits.

In the prior art, a dedicated circuit is needed for converting a 13-bit syndrome to a 12-bit error address. In the present embodiment, lower 12 bits of the 13-bit syndrome can be used as an error address. Therefore, the circuit scales of the encoding circuit and decoding circuit can be reduced.

Figure 22:
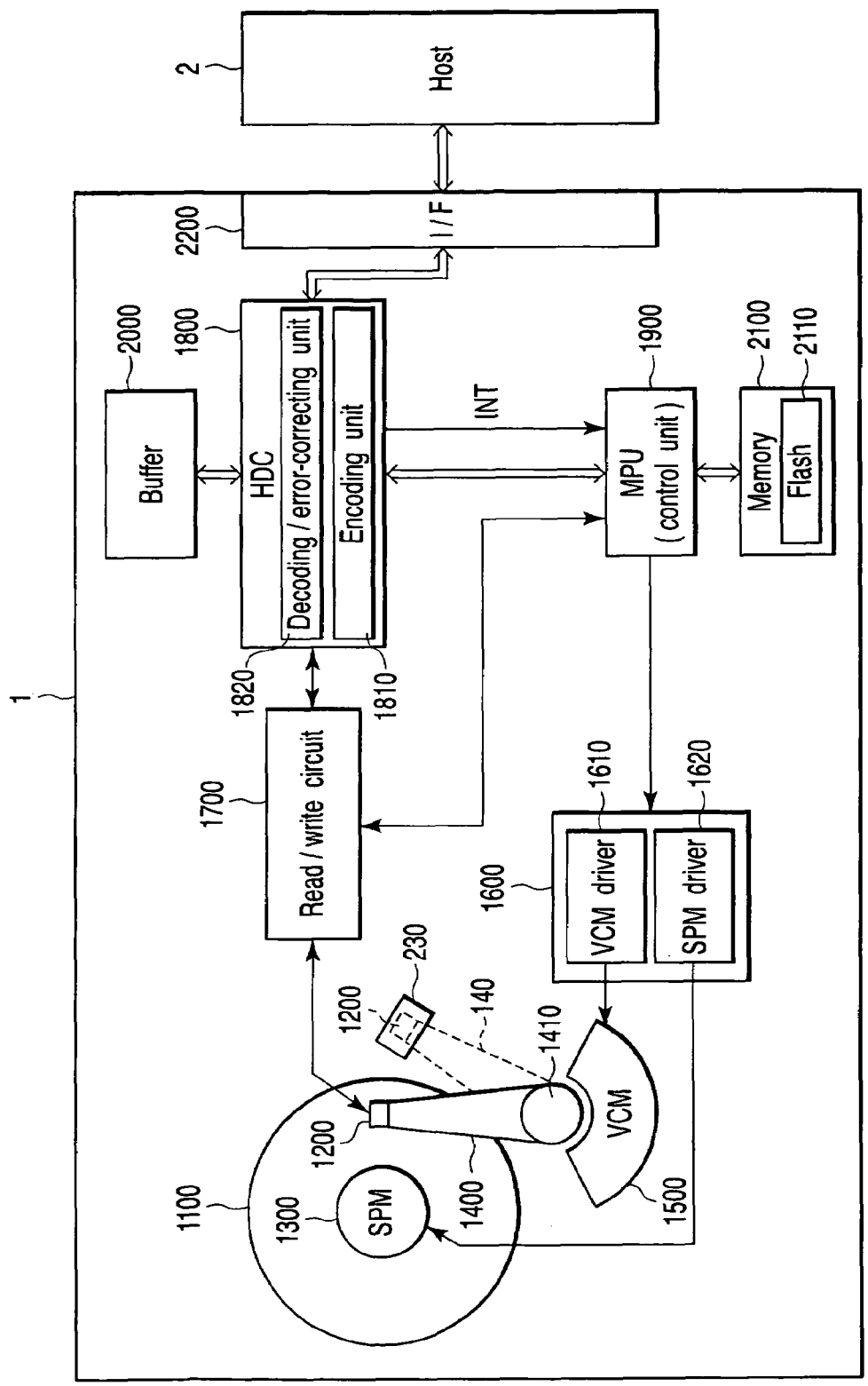
FIG. 22 shows an example of the structure of a storage device to which the system shown in FIG. 1 is applied.

FIG. 22 shows an example of the structure of a storage device to which the encoder and decoder of the present embodiment are applied.

The storage device 1 is a device that is built in an electronic apparatus which functions as a host device 2. The storage device 1 is realized, for example, as a magnetic disk drive (hard disk drive (HDD)) in which data is magnetically recorded on a disk medium 1100.

The storage device 1 comprises the disk medium 1100, a head 1200, a spindle motor (SPM) 1300, an actuator 1400, a voice coil motor (VCM) 1500, a motor driver IC 1600, a read/write circuit 1700, a hard disk controller (HDC) 1800, a microprocessor unit (MPU) 1900, a buffer 2000, a memory 2100, an interface circuit 2200, and a ramp mechanism 230.

The disk medium 1100 is a storage medium for magnetically recording data. The head 1200 is a magnetic head and executes data write on the disk medium 1100 and data read from the disk medium 1100. The head 1200 includes a read head for executing a read operation and a write head for executing a write operation. The head 1200 is mounted at a distal end portion of the actuator 1400.

The disk medium 1100 is fixed to the spindle motor (SPM) 1300. The spindle motor (SPM) 1300 is a motor for rotating the disk medium 1100. The actuator 1400 is driven by the voice coil motor (VCM) 1500 and moves the head 1200 in a radial direction of the disk medium 1100. The actuator 1400 is composed of a head arm that is rotatably supported on a shaft 1410.

The motor driver IC 1600 comprises a VCM driver 1610 for driving the voice coil motor (VCM) 1500, and an SPM driver 1620 for driving the spindle motor (SPM) 1300. The VCM driver 1610 and SPM driver 1620 are controlled by the MPU 1900.

The read/write circuit 1700 is composed of a pre-amplifier circuit and a read/write channel. The pre-amplifier circuit includes a read amplifier which amplifies a read signal that is output from the read head 1200, and a write amplifier. The write amplifier converts a write data signal, which is output from the read/write channel, to a write current signal, and sends the write current signal to the write head.

The HDC 1800 executes, under the control of the MPU 1900, a read/write control process by using the read/write circuit 1700. The HDC 1800 includes an encoding unit 1810 and a decoding/error-correcting unit 1820. The encoding unit 1810 corresponds to the encoder 11 shown in FIG. 1, and the decoding/error-correcting unit 1820 corresponds to the decoder 13 and error correction circuit 14 shown in FIG. 1. The encoding unit 1810 and the decoding/error-correcting unit 1820 are used to detect and correct an error which occurs at the time of writing/reading data in/from the buffer 2000 that functions as a memory medium.

Specifically, the encoding unit 1810 encodes write data from the host device 2 and generates a parity check code. The write data, to which the parity check code is added, is temporarily written in the buffer 2000 by a write unit within the HDC 1800. When the write data is to be written on the disk medium 1100, the write data, to which the parity check code is added, is read out of the buffer 2000 by a read unit within the HDC 1800 and is sent to the decoding/error-correcting unit 1820. The decoding/error-correcting unit 1820 decodes the data to which the parity check code is added, and generates a syndrome. According to an error address that is obtained from the generated syndrome, the decoding/error-correcting unit 1820 executes an error correction process. The write data after error correction is written on the disk medium 1100 by the read/write circuit 1700.

The MPU 1900 is a control unit which controls the operation of the storage device 1, and executes a program stored in the memory 2100. The memory 2100 stores the program that is executed by the MPU 1900.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A decoding device which decodes a (k+m) bit codeword including k-bit information symbols and an m-bit parity check code which is composed of a 1-bit correctable Hamming code, comprising:

a syndrome calculation unit which is configured to calculate, in accordance with a check matrix, an m-bit syndrome corresponding to the (k+m) bit codeword, the m-bit parity check code being generated in accordance with a generator matrix corresponding to the check matrix, the check matrix including a unit matrix and a coefficient matrix, a most significant bit of each of a second vector to a last vector in the coefficient matrix being 1, binary codes with values 1 to k−1 being sequentially arranged from the second vector to the last vector in a matrix which is obtained by excluding the most significant bits of the second to the last vectors from the matrix comprising the second to the last vectors, a first vector of the coefficient matrix disagreeing with the other vectors in the check matrix, the first vector being composed of a specified bit pattern having a most significant bit of 0, and said k and said m being integers which satisfy restrictive conditions of $k+m \leq 2^m-1$ and $k \leq 2^{(m-1)}$; and an error address output unit which is configured to output a lower (m−1) bit data field of the calculated m-bit syndrome as an error address in a case where a most significant bit of the calculated m-bit syndrome is 1 and the calculated m-bit syndrome disagrees with vectors in the unit matrix, and to output 0 as the error address in a case where the calculated m-bit syndrome has the specified bit pattern, the error address being indicative of a bit position in the k-bit information symbols, at which an error occurs.

2. The decoding device according to claim 1, further comprising an error correction unit which corrects an error in the k-bit information symbols in accordance with the error address which is output from the error address output unit.

3. The decoding device according to claim 2, wherein the error correction unit inverts a logic value at a bit position in the k-bit information symbols, which is designated by the error address that is output from the error address output unit.

4. The decoding device according to claim 1, wherein the syndrome calculation unit includes a circuit which repeatedly receives the k-bit information symbols, which are included in the (k+m) bit codeword, in units of a data field of bits, the number of which is a power of 2, and executes a matrix arithmetic operation between the data field and the coefficient matrix in units of the received data field, thus generating the m-bit parity check code corresponding to the k-bit information symbols, and also includes a circuit which adds the m-bit parity check code, which is included in the (k+m) bit codeword, to the generated m-bit parity check code, thereby generating the m-bit syndrome corresponding to the (k+m) bit codeword.

5. A storage device comprising:

an encoding unit which is configured to encode k-bit information symbols in accordance with a generator matrix corresponding to a check matrix and to generate a (k+m) bit codeword including the k-bit information symbols and an m-bit parity check code which is composed of a 1-bit correctable Hamming code, the check matrix including a unit matrix and a coefficient matrix, a most significant bit of each of a second vector to a last vector in the coefficient matrix being 1, binary codes with values 1 to k−1 being sequentially arranged from the second vector to the last vector in a matrix which is obtained by excluding the most significant bits of the second to the last vectors from the matrix comprising the second to the last vectors, a first vector of the coefficient matrix disagreeing with the other vectors in the check matrix, the first vector being composed of a specified bit pattern having a most significant bit of 0, and said k and said m being integers which satisfy restrictive conditions of $k+m \leq 2^m-1$ and $k \leq 2^{(m-1)}$;

a write unit which writes the generated (k+m) bit codeword in a storage medium;

a read unit which reads out the (k+m) bit codeword that is stored in the storage medium;

a syndrome calculation unit which is configured to calculate, in accordance with the check matrix, an m-bit syndrome corresponding to the read-out (k+m) bit codeword;

an error address output unit which is configured to output a lower (m−1) bit data field of the calculated m-bit syndrome as an error address indicative of a bit position in the k-bit information symbols, at which an error occurs, in a case where a most significant bit of the calculated m-bit syndrome is 1 and the calculated m-bit syndrome disagrees with vectors in the unit matrix, and to output 0 as the error address in a case where the calculated m-bit syndrome has the specified bit pattern; and an error correction unit which corrects the error in the k-bit information symbols in accordance with the error address which is output from the error address output unit.

6. The storage device according to claim 5, wherein the error correction unit inverts a logic value at a bit position in the k-bit information symbols, which is designated by the error address that is output from the error address output unit.

7. The storage device according to claim 5, wherein the syndrome calculation unit includes a circuit which repeatedly receives the k-bit information symbols, which are included in the (k+m) bit codeword, in units of a data field of bits, the number of which is a power of 2, and executes a matrix arithmetic operation between the data field and the coefficient matrix in units of the received data field, thus generating the m-bit parity check code corresponding to the k-bit information symbols, and also includes a circuit which adds the m-bit parity check code, which is included in the (k+m) bit codeword, to the generated m-bit parity check code, thereby generating the m-bit syndrome corresponding to the (k+m) bit codeword.

8. A decoding method for decoding a (k+m) bit codeword including k-bit information symbols and an m-bit parity check code which is composed of a 1-bit correctable Hamming code, comprising:

calculating, in accordance with a check matrix, an m-bit syndrome corresponding to the (k+m) bit codeword, the m-bit parity check code being generated in accordance with a generator matrix corresponding to the check matrix, the check matrix including a unit matrix and a coefficient matrix, a most significant bit of each of a second vector to a last vector in the coefficient matrix being 1, binary codes with values 1 to k−1 being sequentially arranged from the second vector to the last vector in a matrix which is obtained by excluding the most significant bits of the second to the last vectors from the matrix comprising the second to the last vectors, a first vector of the coefficient matrix disagreeing with the other vectors in the check matrix, the first vector being composed of a specified bit pattern having a most significant bit of 0, and said k and said m being integers which satisfy restrictive conditions of $k+m \leqq 2^m-1$ and $k \leqq 2^{(m-1)}$; and outputting a lower (m−1) bit data field of the calculated m-bit syndrome as an error address indicative of a bit position in the k-bit information symbols, at which an error occurs, in a case where a most significant bit of the calculated m-bit syndrome is 1 and the calculated m-bit syndrome disagrees with vectors in the unit matrix; and outputting 0 as the error address in a case where the calculated m-bit syndrome has the specified bit pattern.

9. The decoding method according to claim 8, further comprising correcting an error in the k-bit information symbols in accordance with the output error address.

10. The decoding method according to claim 9, wherein said correcting the error includes inverting a logic value at a bit position in the k-bit information symbols, which is designated by the output error address.

11. The decoding method according to claim 8, wherein said calculating the syndrome includes repeatedly inputting the k-bit information symbols, which are included in the (k+m) bit codeword, in units of a data field of bits, the number of which is a power of 2, and executing a matrix arithmetic operation between the data field and the coefficient matrix in units of the input data field, thus generating the m-bit parity check code corresponding to the k-bit information symbols, and also includes adding the m-bit parity check code, which is included in the (k+m) bit codeword, to the generated m-bit parity check code, thereby generating the m-bit syndrome corresponding to the (k+m) bit codeword.

* * * * *